(12) United States Patent
Gregory et al.

(10) Patent No.: US 12,282,371 B2
(45) Date of Patent: Apr. 22, 2025

(54) DEVICES, SYSTEMS, AND METHODS FOR MONITORING AN ELECTRONIC DEVICE IN TRANSIT

(71) Applicant: Microsoft Technology Licensing, LLC, Redmond, WA (US)

(72) Inventors: Luke Thomas Gregory, Mercer Island, WA (US); Rick Chun Kit Cheung, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 53 days.

(21) Appl. No.: 17/849,465

(22) Filed: Jun. 24, 2022

(65) Prior Publication Data

US 2023/0418352 A1 Dec. 28, 2023

(51) Int. Cl.
*G06F 1/32* (2019.01)
*G06F 1/3206* (2019.01)
*G06F 1/3296* (2019.01)

(52) U.S. Cl.
CPC .......... *G06F 1/3206* (2013.01); *G06F 1/3296* (2013.01)

(58) Field of Classification Search
None
See application file for complete search history.

(56) References Cited

U.S. PATENT DOCUMENTS

| | | | |
|---|---|---|---|
| 9,435,698 B2 * | 9/2016 | Fish | G05B 23/0235 |
| 2006/0021453 A1 * | 2/2006 | Kutlu | G01L 5/0047 |
| | | | 73/862.474 |
| 2006/0231622 A1 * | 10/2006 | Kieffer | G01L 5/0047 |
| | | | 235/449 |
| 2007/0205791 A1 * | 9/2007 | Ahmad | G01R 31/2817 |
| | | | 73/862.474 |
| 2010/0236334 A1 * | 9/2010 | Koschmieder | G01N 19/08 |
| | | | 73/799 |
| 2010/0292955 A1 * | 11/2010 | Van Stan, II | G01B 11/026 |
| | | | 702/159 |
| 2011/0131003 A1 * | 6/2011 | Tusvik | G07C 3/08 |
| | | | 356/438 |
| 2013/0098989 A1 * | 4/2013 | Salzman | G06Q 10/08 |
| | | | 235/375 |
| 2015/0040665 A1 | 2/2015 | Borkholder et al. | |
| 2015/0296607 A1 * | 10/2015 | Yang | H05K 1/167 |
| | | | 361/749 |

(Continued)

FOREIGN PATENT DOCUMENTS

WO 2007098153 A2 8/2007
WO 2009123474 A2 10/2009

OTHER PUBLICATIONS

"International Search Report and Written Opinion Issued in PCT Application No. PCT/US23/021633", Mailed Date: Aug. 8, 2023, 12 Pages.

*Primary Examiner* — Nitin C Patel
(74) *Attorney, Agent, or Firm* — RAY QUINNEY & NEBEKER P.C.; Paul N. Taylor

(57) ABSTRACT

A status monitoring system includes a status sensor configured to monitor a status of an electronic circuit. If the status monitoring system detects a status that exceeds a threshold, the status monitoring system records the details of the event on the electronic circuit. The status monitoring system operates in a low-power power mode during transit from a manufacturing facility to an installation location.

22 Claims, 8 Drawing Sheets

(56) References Cited

U.S. PATENT DOCUMENTS

| | | |
|---|---|---|
| 2016/0379165 A1 | 12/2016 | Moakley |
| 2017/0350936 A1* | 12/2017 | McMeen ............ G01R 31/2817 |
| 2019/0154475 A1* | 5/2019 | Chen ................ G01R 31/2817 |
| 2020/0103295 A1* | 4/2020 | Schroeder ............. H01L 23/562 |
| 2021/0264757 A1* | 8/2021 | Yang .................... G08B 13/248 |

* cited by examiner

DEVICES, SYSTEMS, AND METHODS FOR MONITORING AN ELECTRONIC DEVICE IN TRANSIT

CROSS-REFERENCE TO RELATED APPLICATIONS

N/A.

BACKGROUND

Computing devices may be manufactured at a facility that is physically separated from an installation and/or operational location. Before installation, the computing device is transported from the manufacturing facility to the installation location. The computing device is handled by one or more responsible agents in transit. In some situations, the responsible agent may cause the computing device to be bumped, jostled, shocked, or otherwise experience a potentially damaging event. In some embodiments, the computing device may be damaged in transit.

BRIEF SUMMARY

In some aspects, the techniques described herein relate to a method for monitoring a status of a printed circuit board (PCB). A status monitoring system may, in a low-power mode of the PCB, provide power to a status sensor from a power source located on the PCB. In the low-power mode and using the status sensor, the status monitoring system may detect an event impacting the PCB and record details of the event at the PCB.

In some aspects, the techniques described herein relate to a printed circuit board (PCB). The PCB includes a base, a status sensor located at the base, a low-power power source providing power to the status sensor, and a memory and processor connected to the status sensor. The memory includes instructions which cause the processor to, in low-power mode, detect an event impacting the PCB using the status sensor and record details of the event in the memory.

In some aspects, the techniques described herein relate to a method for monitoring a status of a printed circuit board (PCB). A status monitoring system, in a low-power mode, monitors a status sensor connected to a base of the PCB and detects an event associated with transit of the PCB, the event including a status magnitude that is greater than a threshold status magnitude. Based on the event, the status monitoring system records the status magnitude on the PCB.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which.

DETAILED DESCRIPTION

This disclosure generally relates to devices, systems, and methods for monitoring and detecting a status of a printed circuit board (PCB) (and other electronic devices) during transit and at other non-connected times. A PCB may experience handling during transit between the manufacturing facility and the installation location. For example, a server may include multiple PCBs, including processors, memory, and the like. After manufacturing, the server may be assembled, packed into shipping material, loaded on one or more transport vehicles (e.g., cars, trucks, airplanes, boats), unloaded from the transport vehicle, and installed in a datacenter. During each of these activities, the server may experience bumps, jostles, temperature changes, and other status changes. In some situations, the server may be impacted or damaged by these status change events.

In accordance with at least one embodiment of the present disclosure, the PCB may include one or more status sensors. The status sensors may be powered by a low-power power source on the PCB. The status sensors may be connected to or integrally formed with the PCB. A status monitoring system may detect status changes of the PCB using the status sensor. For example, the status monitoring system may detect bumps, jostles, temperature, and other status changes that the PCB experiences. If the status change is potentially damaging or otherwise impacts the PCB, the status monitoring system may record the details of the event on the PCB. In this manner, the status monitoring system may determine whether the PCB was damaged during transit between the manufacturing plan and the installation location.

As will be discussed in further detail herein, the status monitoring system may record details about the event on the PCB. For example, when the status monitoring system detects an event, and the details of the event exceed an event threshold, the status monitoring system may record the details of the event on the PCB. When the PCB arrives at the installation location, the PCB may be placed in a high-power mode. In the high-power mode, the PCB may transmit the details of the event to a remote computing device. This may allow the PCB to record events as they happen and transmit them when connected to a larger power source. This may allow computing devices having no independent operating power source to monitor the status of the PCB during transit using a low-power power source. This may allow the owner of the PCB to determine what event caused damage to the PCB.

Figure 1:
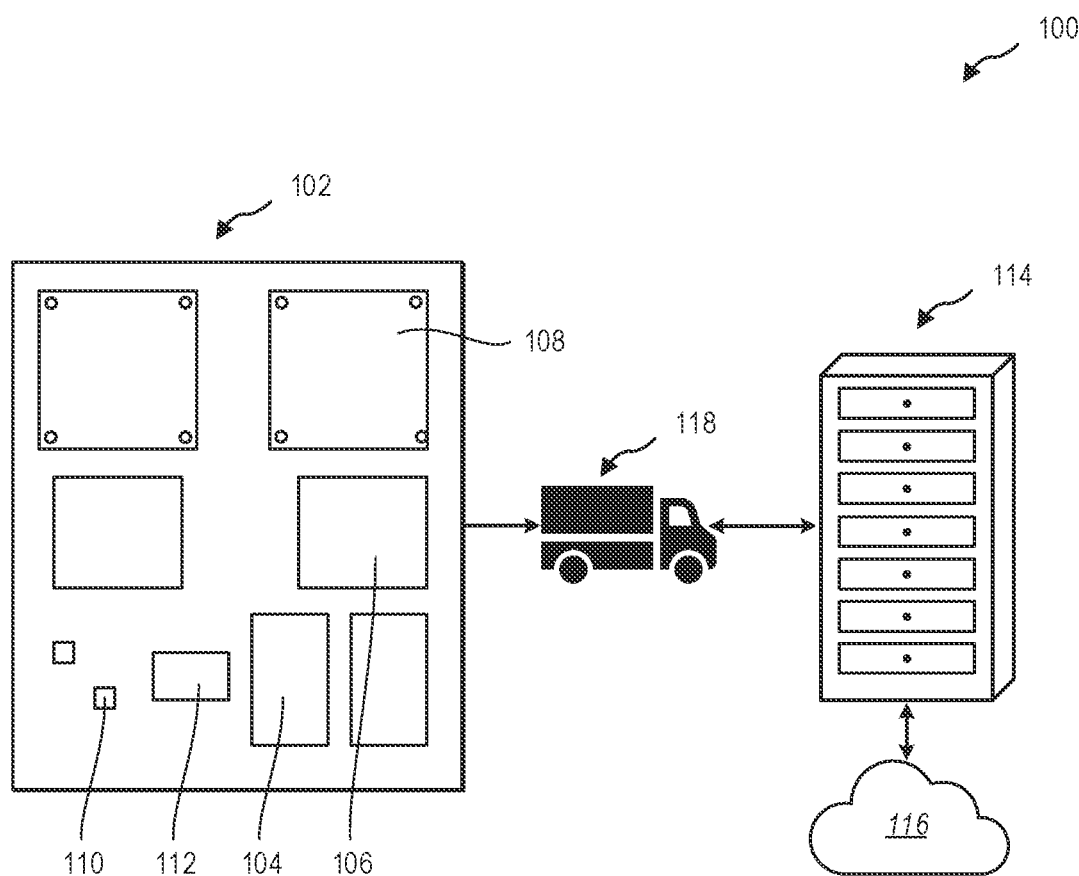
FIG. 1 is a representation of a PCB transit system, according to at least one embodiment of the present disclosure.

FIG. 1 is a representation of a PCB transit system 100, according to at least one embodiment of the present disclosure. The PCB transit system 100 includes a printed circuit board (PCB) 102 that has been manufactured at a manufacturing facility. For example, the PCB 102 may be formed using any manufacturing process, such as lithographic deposition. The PCB 102 may include one or more electronic structures. For example, the PCB 102 may include a processor 104, memory 106, a heat sink 108, any other electronic structure, and combinations thereof.

The PCB 102 may include one or more status sensors 110 connected to the PCB 102. The status sensor 110 may detect a status of the PCB 102. Put another way, the status sensor 110 may measure state information regarding the PCB 102. The status sensor 110 may measure any status (or state information) of the PCB 102, including stress, strain, movement, impacts, bumps, jostles, temperature, any other status (or state information), and combinations thereof. In some embodiments, the status sensor 110 may measure a status magnitude of the status.

In some embodiments, the status sensor 110 may include any type of sensor. For example, the status sensor 110 may include a strain gauge, an accelerometer, a thermometer (or other temperature sensor), any other status sensor 110, and combinations thereof. In some embodiments, the PCB 102 may include multiple status sensors 110. For example, the PCB 102 may include a first status sensor 110 that is a strain gauge and a second status sensor 110 that is a temperature sensor. In some examples, the PCB 102 may include a first status sensor 110 that is a strain gauge and a second status sensor 110 that is an accelerometer. In some examples, the PCB 102 may include a first status sensor 110 that is an accelerometer, and a second status sensor 110 that is a temperature sensor. In some embodiments, the PCB 102 may include a first status sensor 110 that is a strain gauge, a second status sensor 110 that is an accelerometer, and a third status sensor 110 that is a temperature sensor. In some embodiments, the PCB 102 may include multiple of the same types of status sensors 110. For example, the PCB 102 may include two or more strain gauges, accelerometers, or temperature sensors.

In some embodiments, the status sensor 110 may be powered by a low-power power supply 112. The low-power power supply 112 may be integrated into the PCB 102. For example, the low-power power supply 112 may be formed as an electronic structure on the PCB 102. The low-power power supply 112 may include any type of low-power power supply. For example, the low-power power supply 112 may include a capacitor, a supercapacitor, a battery, any other low-power power supply 112, and combinations thereof. The low-power power supply 112 may be connected to the status sensor 110. Put another way, the low-power power supply 112 may provide power to the status sensor 110. This may allow the status sensor 110 to collect measurements when the PCB 102 is not connected to a primary power source.

The PCB 102 does not include a device battery. For example, the PCB 102 may include a server or other computing device configured to be installed in a datacenter. The PCB 102 may be powered using an external power source, such as a primary power source or other power source. When the PCB 102 is not connected to the primary power source, the PCB 102 may not have any power to perform processing functions.

In accordance with at least one embodiment of the present disclosure, the low-power power supply 112 may provide power to the status sensor 110 while the PCB 102 is not connected to the primary power source. In some embodiments, the low-power power supply 112 may be configured to transfer low power to the status sensor 110. In some embodiments, the low-power power supply 112 may provide any amount of power to the status sensor 110, including 1 mW, 5 mW, 10 mW, 15 mW, 20 mW, 25 mW, 30 mW, 40 mW, 50 mW, 75 mW, 100 mW, 250 mW, 500 mW, 1 W, or any value therebetween. In some embodiments, it may be critical that the low-power power supply 112 provides less than 15 mW of power to allow the low-power power supply 112 to power the status sensor 110 without draining the charge from the low-power power supply 112.

In accordance with at least one embodiment of the present disclosure, the low-power power supply 112 may provide power to the status sensor 110 during transit from the manufacturing facility to an installation location 114. As used herein, "transit" may be any period of time after manufacturing of the PCB 102 and before installation of the PCB 102 in the installation location 114. For example, transit may include assembly, handling, storage, transportation, shipping, assembly, installation, any other activities between manufacturing and installation, and combinations thereof.

During transit, the PCB 102 may experience state changes. For example, the PCB 102 may experience movement. In some examples, the PCB 102 may experience sudden movements, including bumps, jostles, shocks, drops, any other movement, and combinations thereof. In some situations, the movement experienced by the PCB 102 may cause damage to it. For example, dropping the PCB 102 may cause the PCB 102 to crack, break, or otherwise be damaged. This may impair the function of the PCB 102, and may result in repair or replacement. In some examples, the state change of the PCB 102 may include changes in temperature. For example, the state change of the PCB 102 may include increases in temperature, decreases in temperature, maintenance of the PCB 102 at a particular temperature, and combinations thereof. Such temperature states may be a result of conditions of the PCB 102 during transit.

As discussed herein, the status sensor 110 may monitor the status of the PCB 102 in transit. For example, the status sensor 110 may include a strain gauge that may monitor stress and strain of the PCB 102 in transit. This may allow the status sensor 110 to determine that the PCB 102 has experienced bending forces, such as through mishandling, stacking too much weight on it, dropping, and so forth. In some examples, the status sensor 110 may include an accelerometer that may monitor motion of the PCB 102 in transit. This may allow the status sensor 110 to monitor sudden accelerations and decelerations of the PCB 102. In this manner, the status sensor 110 may determine whether the PCB 102 has been dropped, bumped, or otherwise been exposed to shocks or sudden movements. In some embodiments, the status sensor 110 may include a temperature sensor that may monitor changes in temperature of the PCB 102.

As discussed herein, the low-power power supply 112 may provide power to the status sensor 110 while the PCB 102 is in transit. Conventionally, the PCB 102 is not monitored in transit. Damage that occurs in transit may not be traceable to a particular event. By powering the status sensor 110 in transit, a status monitoring system may identify events that the PCB 102 may experience in transit. This may allow the owner of the PCB 102 to identify the event that caused damage to the PCB 102.

In some embodiments, the status monitoring system may identify an event experienced by the PCB 102. For example, the status monitoring system may identify event thresholds for particular states. The event thresholds may be associated with state changes that may damage the PCB 102. For example, an event threshold may include a temperature, a stress or a strain, an acceleration, a duration at a particular state, any other event threshold, and combinations thereof. When the status monitoring system identifies that the status sensor 110 has detected a status of the PCB 102 that exceeds a status threshold, the status monitoring system may identify or determine that an event has occurred.

In some embodiments, the status monitoring system may cause the PCB 102 to store a record of the event in the memory 106. For example, when, using the status sensor 110, the status monitoring system detects a status having a magnitude that is greater than the event threshold, the status monitoring system may determine that an event occurred. Based on the occurrence of the event, the status monitoring system may record the event on the memory 106. In some embodiments, the event may be recorded on the memory 106 located on the PCB 102. Put another way, the event may be recorded directly on the PCB 102. In some embodiments, the status monitoring system may record the event on the PCB 102 without transmitting the event to a remote computing device.

In accordance with at least one embodiment of the present disclosure, recording the event on the memory 106 of the PCB 102 may occur while the PCB 102 is in the low-power mode. Put another way, the event may be recorded on the memory 106 while the low-power power supply 112 is providing power to the PCB 102. In this manner, the status monitoring system may record events as they occur.

After the PCB 102 is installed in the installation location 114 and placed in a higher-power mode, such as an operating mode, a transmit mode, or other higher-power mode, the status monitoring system may cause the PCB 102 to transmit the details of the event to a remote computing device 116. For example, the PCB 102, when installed in the installation location 114, may be connected to the Internet. The PCB 102 may transmit the details of the event to the remote computing device 116, including the status magnitude, the timestamp, which status sensor 110 captured the information, the duration of the event, any other details, and combinations thereof. This may allow the owner of the PCB 102, who may not be directly involved in the transit of the PCB 102, to determine whether an event occurred to the PCB 102 in transit.

In some situations, the PCB 102 may be damaged in transit. For example, a worker or technician may drop the PCB 102, which may damage it. In some situations, the worker may not know that he or she has damaged the PCB 102, or the worker may elect not to report the damage to the PCB 102. If the owner of the PCB 102 determines that the PCB 102 was damaged in transit, the owner may review the recorded details of events experienced by the PCB 102. This may allow the owner to determine which events likely caused the damage to the PCB 102.

In some embodiments, for each stage of the PCB transit system 100, a responsible agent may have custody of or be responsible for the transit of the PCB 102. For example, a shipping company may have custody of or be responsible for shipping 118 the PCB 102, such as by truck, train, boat, plane, drone, other shipping mechanism, and combinations thereof. An installation company may have custody over the PCB 102 during installation at the installation location 114. A manufacturing company may have custody over the PCB 102 during manufacturing, assembly, and packaging. While specific examples of responsible agents have been discussed herein, it should be understood that any number or type of responsible agents may have custody of the PCB 102 during transit.

The PCB transit system 100 may include a chain of custody for the PCB 102. For example, the PCB transit system 100 may include records of transfers of custody, including the name of the responsible agents and timestamps accompanying changes in custody. When the owner of the PCB 102 has determined that the PCB 102 has been damaged, the owner may review the details of events recorded on the PCB 102, including timestamps of the events. The owner may correlate the timestamp of the event with the chain of custody to determine the responsible agent that had custody over the PCB 102 at the time of the event. In this manner, the owner may determine who has liability to repair or replace damaged PCBs 102.

Figure 2:
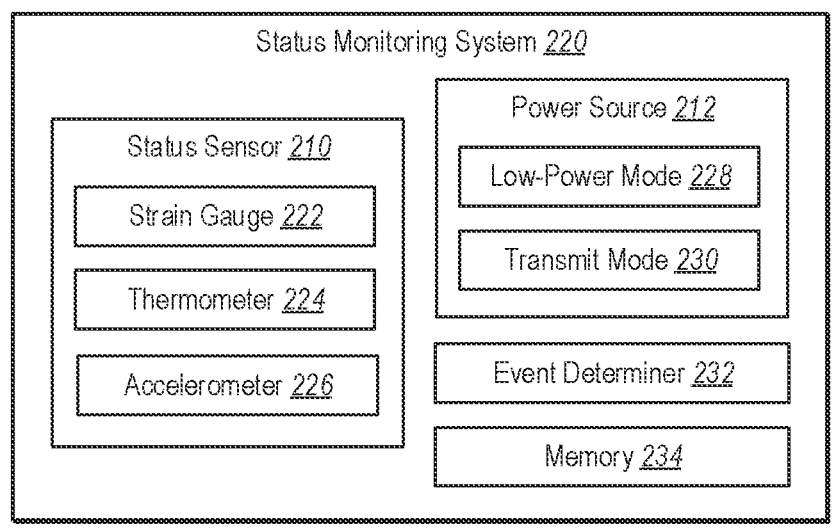
FIG. 2 is a representation of a status monitoring system for a PCB, according to at least one embodiment of the present disclosure.

FIG. 2 is a representation of a status monitoring system 220 for a PCB (e.g., the PCB 102 of FIG. 1), according to at least one embodiment of the present disclosure. Each of the components of the status monitoring system 220 can include software, hardware, or both. For example, the components can include one or more instructions stored on a computer-readable storage medium and executable by processors of one or more computing devices, such as a client device or server device. When executed by the one or more processors, the computer-executable instructions of the status monitoring system 220 can cause the computing device(s) to perform the methods described herein. Alternatively, the components can include hardware, such as a special-purpose processing device to perform a certain function or group of functions. Alternatively, the components of the status monitoring system 220 can include a combination of computer-executable instructions and hardware.

Furthermore, the components of the status monitoring system 220 may, for example, be implemented as one or more operating systems, as one or more stand-alone applications, as one or more modules of an application, as one or more plug-ins, as one or more library functions or functions that may be called by other applications, and/or as a cloud-computing model. Thus, the components may be implemented as a stand-alone application, such as a desktop or mobile application. Furthermore, the components may be implemented as one or more web-based applications hosted on a remote server. The components may also be implemented in a suite of mobile device applications or "apps."

The status monitoring system 220 may include one or more status sensors 210. The status sensors 210 may include a strain gauge 222, a thermometer 224, an accelerometer 226, or any other status sensor 210. As discussed herein, the strain gauge 222 may measure stress and/or strain experienced by the PCB. This may help the status monitoring system 220 to determine whether the PCB has experienced bending or other stresses to the body or structure of the PCB. In some embodiments, the strain gauge 222 may be integrally formed with the PCB. For example, the strain gauge 222 may be deposited as part of a layer of the PCB. This may allow the strain gauge 222 to detect internal stress and/or strains experienced by the PCB. In some embodiments, the strain gauge 222 may be manufactured separately from the PCB. The strain gauge 222 may be connected to an outer surface of the PCB. This may allow the strain gauge 222 to measure stress and/or strain of the PCB at any location on the PCB.

In some embodiments, the thermometer 224 may be integrally formed as part of the body of the PCB. For example, the thermometer 224 may include a thermocouple, and the thermocouple may be deposited as part of a layer of the PCB. This may help to ensure that the thermometer 224 is measuring the temperature experienced by the PCB. In some embodiments, the thermometer 224 may be manufactured separately from the PCB. The thermometer 224 may be attached to any part of the PCB. This may allow the thermometer 224 to measure the temperature of the PCB at any location on the PCB. In some embodiments, the thermometer 224 may include the thermometer that measures the operating temperature of the PCB.

In some embodiments, the accelerometer 226 may be integrally formed as part of the body of the PCB. For example, the elements of the accelerometer 226 may be deposited as part of a layer of the PCB. This may allow the accelerometer 226 to measure the forces applied to the PCB at an internal location of the PCB. In some embodiments, the accelerometer 226 may be manufactured separately from and later connected to the PCB. This may allow the accelerometer 226 to measure the forces on the PCB at any location on the PCB.

In some embodiments, the status sensors 210 may be directly connected to the PCB. For example, the status sensors 210 may be directly connected to the body of the PCB or the base of the PCB. This may allow the status sensors 210 to detect status events experienced by the PCB at the PCB. In some embodiments, the status sensors 210 may be connected to the packaging of the PCB. This may improve the ease of installation of the status sensors 210, while allowing the status sensors 210 to experience most of the forces applied to the PCB.

In some embodiments, the status monitoring system 220 may include a power source 212. The power source 212 may be a low-power power source. The power source 212 may provide power to the status sensors 210. In some embodiments, the power source 212 may have sufficient power to power the status sensors 210 and/or record data collected by the status sensors 210. In some embodiments, the power source 212 may have insufficient power to power operation of the PCB. This may reduce the size and/or capacity of the power source 212, thereby allowing the power source 212 to be cheaply and easily manufactured.

In some embodiments, the power source 212 may be integrally formed as part of the body of the PCB. For example, the power source 212 may include a capacitor, supercapacitor, battery, or other element that is deposited on a layer of the PCB. In some embodiments, the power source 212 may be manufactured separately from and later connected to the PCB.

The power source 212 may operate in one or more power modes. For example, while the status monitoring system 220 is collecting measurements from the power source 212 and/or recording the measurements on the PCB, the power source 212 may operate in a low-power mode 228. In the low-power mode 228, the power source 212 may have sufficient power to collect and record measurements by the status sensors 210. In some embodiments, in the low-power mode 228, the status monitoring system 220 may collect measurements for an extended period of time. In some embodiments, in the low-power mode 228, the status monitoring system 220 may collect measurements from the status sensors 210 throughout the duration of transit between the manufacturing facility and the installation location, including during storage (such as storage after manufacturing and/or storage before installation).

In some embodiments, the power source 212 may operate in a transmit mode 230. In the transmit mode 230, the status monitoring system 220 may be configured to transmit one or more messages containing details of events experienced by the PCB to a remote computing device. For example, if a status measured by one of the status sensors 210 exceeds a threshold, then the status monitoring system 220 may transition or change to the transmit mode 230 and transmit the details of the event to a remote computing device. In this manner, an owner of the PCB may determine that an event occurred as soon as the event occurred. This may allow the owner to communicate the occurrence of the event to the responsible agent as soon as the event occurs.

In accordance with at least one embodiment of the present disclosure, the status monitoring system 220 may include an event determiner 232. The event determiner 232 may analyze measurements from the status sensors 210 to determine whether an event occurred. For example, the event determiner 232 may receive measurements from the status sensors 210 and compare them to event thresholds. If the measurements exceed the event thresholds, the status sensors 210 may determine that an event has occurred. In some embodiments, if the event determiner 232 has determined that an event has occurred, the event determiner 232 may record the event in memory 234 of the PCB. This may allow the status monitoring system 220 to create a record of events experienced by the PCB. As discussed herein, the event determiner 232 may analyze and record the measurements by the status sensors 210 in the low-power mode 228.

In some embodiments, the event determiner 232 may continuously monitor measurements by the status sensors 210 on the PCB. For example, the event determiner 232 may periodically take status measurements of the PCB using the status sensors 210. In some embodiments, a measurement frequency of the status sensors 210 may include any measurement frequency, including 0.1 Hz, 1 Hz, 5 Hz, 10 Hz, 25 Hz, 50 Hz, 100 Hz, 500 Hz, 1 kHz, or any value therebetween. This may allow the event determiner 232 to determine whether an event has occurred. In some embodiments, the status monitoring system 220 may record every measurement collected by the status sensors 210. This may allow the owner of the PCB to analyze each measurement to determine whether an event occurred. For example, the owner of the PCB may receive the status measurements and analyze trends in the status measurements. In some embodiments, the owner of the PCB may analyze status measurements across multiple devices. This may allow the owner of the PCB to analyze trends across multiple PCB devices.

In some embodiments, as discussed herein, the event determiner 232 may determine whether an event exceeds a transmit threshold. The transmit threshold may be associated with an event which may be significant enough to transmit to the owner. If the transmit threshold has been exceeded, the status monitoring system 220 may transition from the low-power mode 228 to the transmit mode 230. In the transmit mode 230, the status monitoring system 220 may transmit the details of the event to the owner of the PCB. This may allow the owner of the PCB to know of an event immediately after or shortly after the event occurs. In this manner, the owner may implement one or more mitigation protocols based on the receipt of the details of the event.

FIGS. 3-7, the corresponding text, and the examples provide a number of different methods, systems, devices, and non-transitory computer-readable media of the status monitoring system 220. In addition to the foregoing, one or more embodiments can also be described in terms of flowcharts comprising acts for accomplishing a particular result, as shown in FIG. 3-7. FIG. 3-7 may be performed with more or fewer acts. Further, the acts may be performed in differing orders. Additionally, the acts described herein may be repeated or performed in parallel with one another or parallel with different instances of the same or similar acts.

Figure 3:
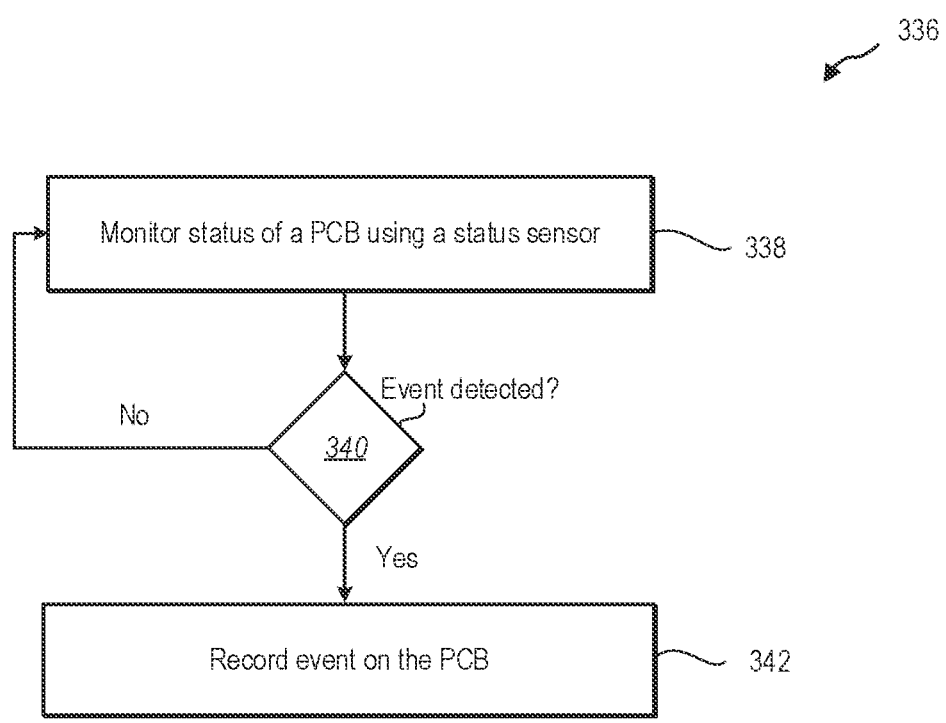
FIG. 3 is a flowchart of a method for monitoring a PCB, according to at least one embodiment of the present disclosure.

As mentioned, FIG. 3 illustrates a flowchart of a method 336 for monitoring a PCB in transit, in accordance with one or more embodiments. While FIG. 3 illustrates acts according to one embodiment, alternative embodiments may omit, add to, reorder, and/or modify any of the acts shown in FIG. 3. The acts of FIG. 3 can be performed as part of a method. Alternatively, a non-transitory computer-readable medium can comprise instructions that, when executed by one or more processors, cause a computing device to perform the acts of FIG. 3. In some embodiments, a system can perform the acts of FIG. 3.

In some embodiments, the status monitoring system monitor a status of a PCB using a status sensor at 338. For example, as discussed herein, the status monitoring system may monitor measurements of the status sensors. The status monitoring system may determine 340 whether an event has been detected. If an event has not been detected, the status monitoring system may continue to monitor the status of the PCB. If an event has been detected, then the status monitoring system may record the event on the PCB at 342. As discussed herein, this may generate a record of events experienced by the PCB, thereby allowing the owner of the PCB to determine if an event occurred and/or if a particular event was responsible for damage to the PCB.

In some embodiments, recording the event on the PCB may include recording details of the event on the PCB. For example, details of the event may include one or more measurements from the status sensors, timestamps associated with the measurements, collections of a plurality of measurements associated with an event, and so forth. In some embodiments, if an event is detected on a first status sensor, the status monitoring system may record measurements from each status sensor during the duration of the event. This may allow the owner to determine whether any other status changes hand an impact on the event, even if the status measurements did not exceed a particular threshold.

Figure 4:
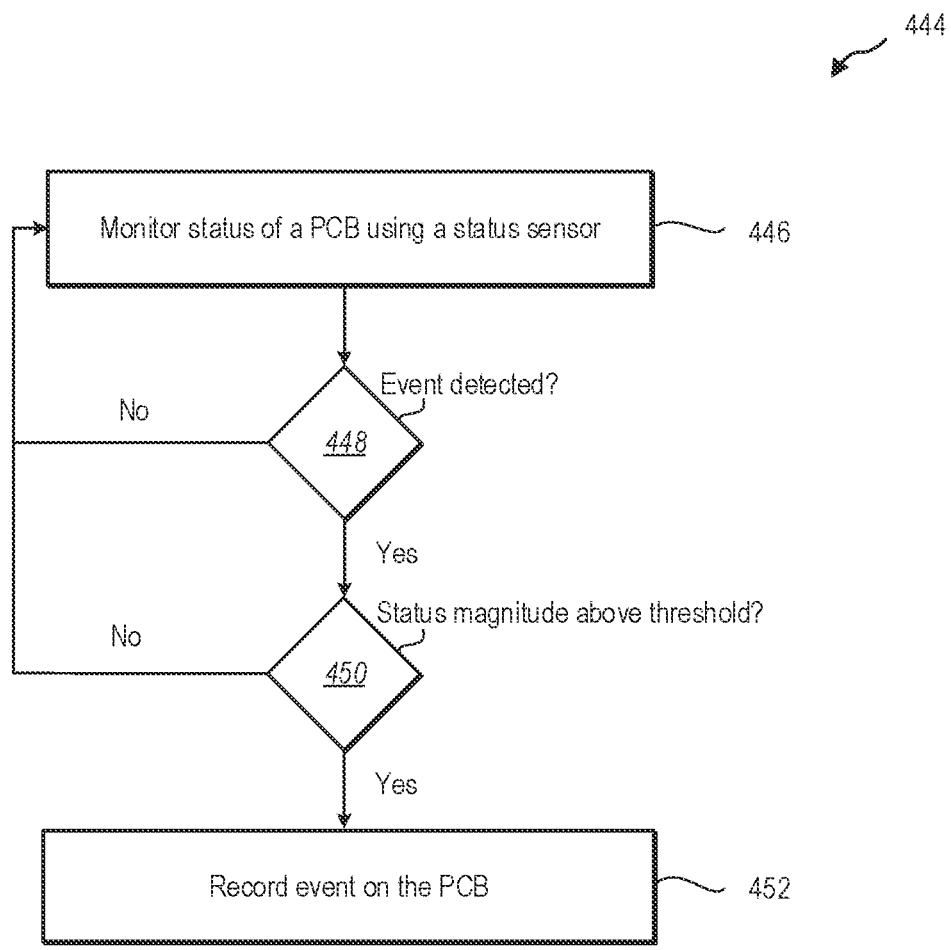
FIG. 4 is a flowchart of a method for monitoring a PCB, according to at least one embodiment of the present disclosure.

As mentioned, FIG. 4 illustrates a flowchart of a method 444 for monitoring a PCB in transit, in accordance with one or more embodiments. While FIG. 4 illustrates acts according to one embodiment, alternative embodiments may omit, add to, reorder, and/or modify any of the acts shown in FIG. 4. The acts of FIG. 4 can be performed as part of a method. Alternatively, a non-transitory computer-readable medium can comprise instructions that, when executed by one or more processors, cause a computing device to perform the acts of FIG. 4. In some embodiments, a system can perform the acts of FIG. 4.

In some embodiments, the status monitoring system monitor a status of a PCB using a status sensor at 446. For example, as discussed herein, the status monitoring system may monitor measurements of the status sensors. The status monitoring system may determine 448 whether an event has been detected. If an event has not been detected, the status monitoring system may continue to monitor the status of the PCB.

If an event has been detected, then the status monitoring system may determine 450 whether the measurement from the status sensor has a status magnitude (or a measurement value) that is above an event threshold. If the status magnitude is not above an event threshold, then the status monitoring system may continue to monitor the status of the PCB using the status sensor. If the status magnitude is above the threshold, then the status monitoring system may record the details of the event on the PCB at 452. This may help to reduce the amount of information recorded on the PCB and/or reduce the power consumption of the status monitoring system by reducing the amount of recording of information on the PCB.

In some embodiments, the event threshold may be established based on measurements that may be associated with damage to the PCB. In some embodiments, the event threshold may be any type of threshold. For example, the event threshold may be a stress threshold or a strain threshold. If a strain gauge measures a stress or a strain that is greater than the stress threshold or the strain threshold, then the status monitoring system may determine that an even has occurred and record the event on the PCB. In some embodiments, the stress threshold or the strain threshold may be set based on stresses or strains that are associated with damage to a PCB or other electronic device.

For example, the strain threshold may be greater than $1\times10^{-9}$, greater than $1\times10^{-8}$, greater than $1\times10^{-7}$, greater than $1\times10^{-6}$, greater than $1\times10^{-5}$, greater than $1\times10^{-4}$, greater than $1\times10^{-3}$, greater than $1\times10^{-2}$, or any value therebetween.

In some examples, the stress threshold may be greater than 100 Pa, greater than 1 kPa, greater than 10 kPa, greater than 100 kPa, greater than 1 MPa, greater than 10 MPa, greater than 100 MPa, greater than 1 GPa, greater than 10 GPa, greater than 100 GPA, or any value therebetween.

In some examples, the event threshold may be an acceleration threshold. For example, the acceleration threshold may be an acceleration force applied to the PCB. If an accelerometer measures an acceleration above the acceleration threshold, then the status monitoring system may determine that an event has occurred and record the event on the PCB. In some embodiments, the acceleration threshold may be established based on accelerations that are associated with damage to a PCB or other electronic device.

For example, the acceleration threshold may be associated with a shock event. In some embodiments, the acceleration threshold may be greater than 1 g (e.g., 1 g is equal to the force of gravity on the object with no external force applied and greater than 1 g is a force that is greater than the force of gravity). In some embodiments, the acceleration threshold may be greater than or equal to 2 g, greater than or equal to 3 g, greater than or equal to 4 g, greater than or equal to 5 g, greater than or equal to 6 g, greater than or equal to 7 g, greater than or equal to 8 g, greater than or equal to 9 g, greater than or equal to 10 g, greater than or equal to 15 g, greater than or equal to 20 g, or any value therebetween.

In some examples, the event threshold may be a temperature threshold. For example, the temperature threshold may be a temperature experience by the PCB. In some embodiments, the temperature threshold may be a high temperature threshold. The high temperature threshold may be a temperature above which is associated with damage to the PCB. In some embodiments, the temperature threshold may be a low temperature threshold. The low temperature threshold may be a temperature below which is associated with damage to the PCB. If the status monitoring system detects a temperature that exceeds the temperature threshold (e.g., a temperature that is above the high temperature threshold or below the low temperature threshold), the status monitoring system may determine that an event has occurred and may record the event on the PCB.

In some embodiments, the temperature threshold may include a duration at the temperature threshold. For example, a high temperature threshold may include a high temperature duration. If the status monitoring system determines that the PCB experiences a temperature that exceeds the threshold (e.g., above the high temperature threshold or below the low temperature threshold) for a temperature duration threshold, the status monitoring system may determine that an event has occurred and record the event. In some embodiments, the temperature threshold may include tiers of temperature thresholds. Each tier of temperature thresholds may include a temperature and an associated temperature duration. In some examples, a high temperature threshold may include a first high temperature and a first high temperature duration. A second high temperature may be higher than the first high temperature, and a second high temperature duration may be lower than the first high temperature duration. This may be because a PCB may experience higher temperatures for a shorter amount of time than lower temperatures without damage. In some examples, a low temperature threshold may include a first low temperature and a first low temperature duration. A second low temperature may be lower than the first low temperature and a second low temperature duration may be less than the first low temperature duration. This may be because a PCB may experience lower temperatures for a shorter amount of time than higher temperatures without damage. In this manner, the status monitoring system may determine an event based on both temperature and duration.

In some embodiments, when the status monitoring system records an event on the PCB, the status monitoring system may record details about the event from a period of time before the measurement exceeded the threshold. This may allow the status monitoring system to analyze the status of the PCB leading up to the event, thereby allowing the system monitoring system to further determine the conditions of the event.

In some embodiments, as discussed herein, the status monitoring system may record the details of the event the entire time the measured status exceeds the threshold. This may allow the owner of the PCB to analyze the event throughout its duration. In some embodiments, the status monitoring system may record the details of the event for a period of time after the measured status has returned below the threshold. This may allow the status monitoring system to identify the conditions of the PCB after the status is reduced to below the threshold. In this manner, the owner of the PCB may determine the conditions of the PCB after the event has ended, to determine how that impacted any damage to the PCB.

Figure 5:
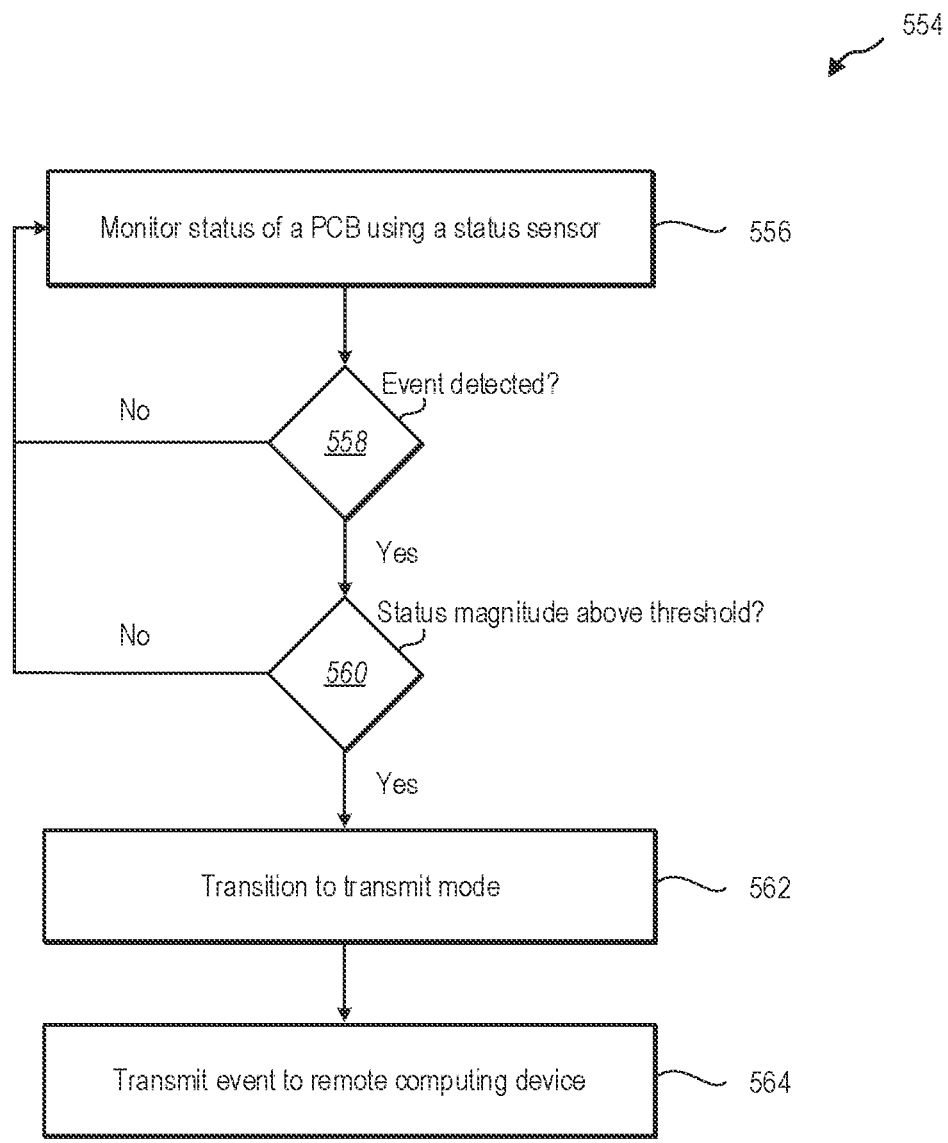
FIG. 5 is a flowchart of a method for monitoring a PCB, according to at least one embodiment of the present disclosure.

As mentioned, FIG. 5 illustrates a flowchart of a method 554 for monitoring a PCB in transit, in accordance with one or more embodiments. While FIG. 5 illustrates acts according to one embodiment, alternative embodiments may omit, add to, reorder, and/or modify any of the acts shown in FIG. 5. The acts of FIG. 5 can be performed as part of a method. Alternatively, a non-transitory computer-readable medium can comprise instructions that, when executed by one or more processors, cause a computing device to perform the acts of FIG. 5. In some embodiments, a system can perform the acts of FIG. 5.

In some embodiments, the status monitoring system monitor a status of a PCB using a status sensor at 556. For example, as discussed herein, the status monitoring system may monitor measurements of the status sensors. The status monitoring system may determine 558 whether an event has been detected. If an event has not been detected, the status monitoring system may continue to monitor the status of the PCB.

If an event has been detected, then the status monitoring system may determine 560 whether the measurement from the status sensor has a status magnitude (or a measurement value) that is above a transmit threshold. If the status magnitude is not above the transmit threshold, then the status monitoring system may continue to monitor the status of the PCB using the status sensor.

If the status magnitude is above the transmit threshold, then the status monitoring system may transition to the transmit mode at 562. As discussed herein, transitioning to the transmit mode may increase the power output from the low-power power source to the status monitoring system. The power output from the low-power power source in the transmit mode may be sufficient to transmit the event to a remote computing device. This may allow the status monitoring system to transmit the details of the event to the remote computing device at 564.

In accordance with at least one embodiment of the present disclosure, transmitting the details of the event to the remote computing device may occur while the PCB is in transit. In some embodiments, the status monitoring system may transmit the event to the remote computing device while the event is occurring. This may allow the owner of the PCB to identify an event in real-time and perform one or more mitigation protocols in real-time. For example, if the owner is notified of the event, the owner may contact the responsible agent. This may allow the responsible agent to adjust the circumstances surrounding the event before the PCB is damaged. In some embodiments, the status monitoring system may transmit the event to the remote computing device after the event has finished (e.g., after the measured status no longer exceeds the threshold). This may allow the owner to be notified of the event after it occurs, but before the PCB is installed at the installation location, thereby preventing installation of damaged PCBs.

In some embodiments, the status monitoring system may transition to the transmit mode as soon as the status is measured at above the threshold. This may allow the status monitoring system to transmit the details of the event as they are occurring. In some embodiments, the status monitoring system may transition to the transmit mode after the event has concluded. This may help to reduce the power drain on the low-power power source by reducing the amount of time the status monitoring spends in the transmit mode.

Figure 6:
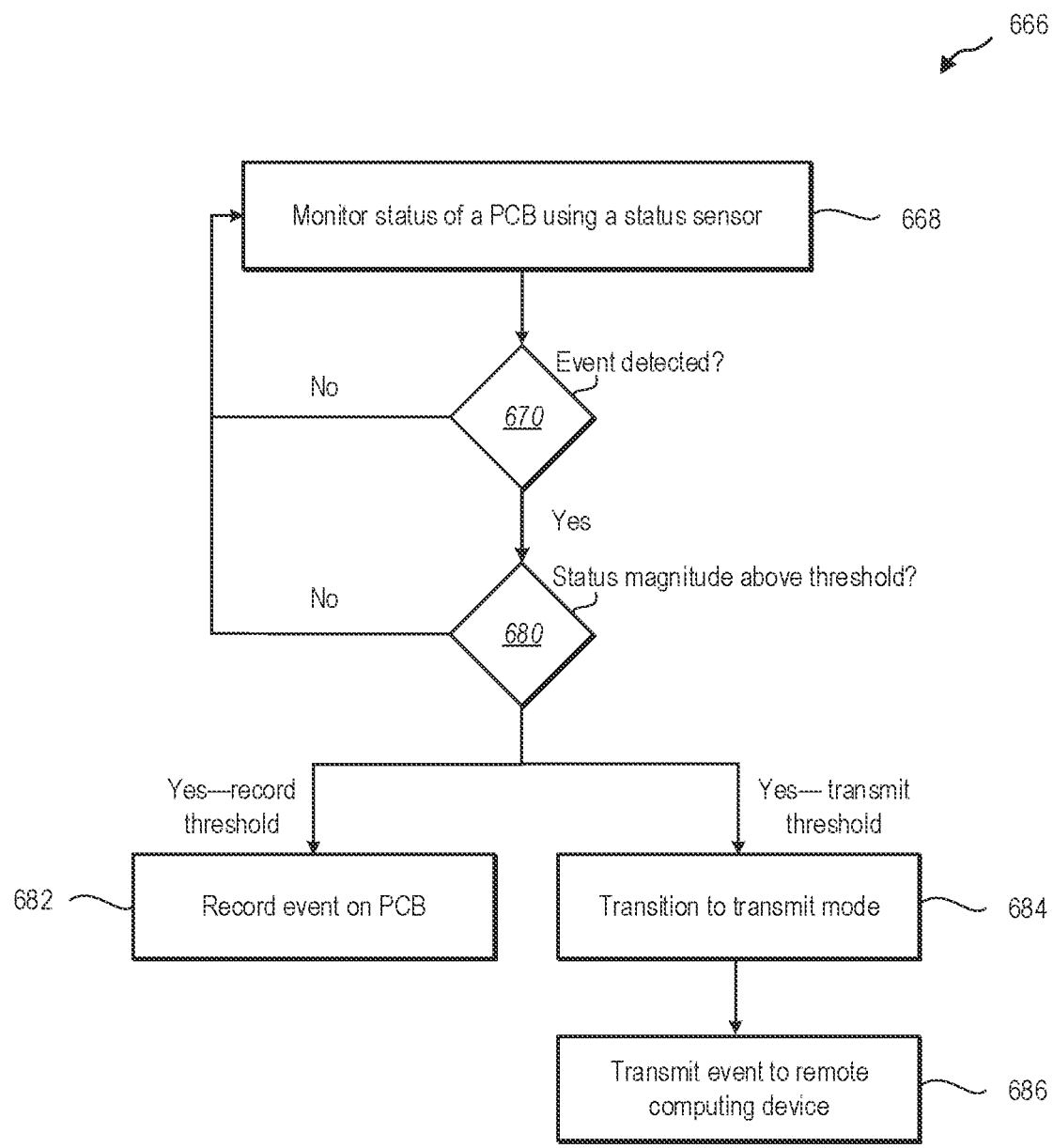
FIG. 6 is a flowchart of a method for monitoring a PCB, according to at least one embodiment of the present disclosure.

As mentioned, FIG. 6 illustrates a flowchart of a method 666 for monitoring a PCB in transit, in accordance with one or more embodiments. While FIG. 6 illustrates acts according to one embodiment, alternative embodiments may omit, add to, reorder, and/or modify any of the acts shown in FIG. 6. The acts of FIG. 6 can be performed as part of a method.

Alternatively, a non-transitory computer-readable medium can comprise instructions that, when executed by one or more processors, cause a computing device to perform the acts of FIG. 6. In some embodiments, a system can perform the acts of FIG. 6.

In some embodiments, the status monitoring system monitor a status of a PCB using a status sensor at 668. For example, as discussed herein, the status monitoring system may monitor measurements of the status sensors. The status monitoring system may determine 670 whether an event has been detected. If an event has not been detected, the status monitoring system may continue to monitor the status of the PCB.

If an event has been detected, then the status monitoring system may determine 672 whether the measurement from the status sensor has a status magnitude (or a measurement value) that is above a threshold. If the status magnitude is not above the threshold, then the status monitoring system may continue to monitor the status of the PCB using the status sensor.

In some embodiments, the status monitoring system may determine 680 whether the status magnitude is greater than a record threshold. The record threshold may be a first threshold associated with an event that may be recorded by the status monitoring system. If the status magnitude is greater than the record threshold, the status monitoring system may record the event on the PCB at 682.

In some embodiments, the status monitoring system may determine 680 whether the status magnitude is greater than a transmit threshold. If the status magnitude is greater than the transmit threshold, then the status monitoring system may transition to the transmit mode at 684. In the transmit mode, the status monitoring system may transmit the event to a remote computing device at 686.

In some embodiments, the record threshold may be different from the transmit threshold. For example, the record threshold may be lower than the transmit threshold. The record threshold may be representative of status measurements that are significant enough to record, but not immediately damaging or threatening of damage.

In some embodiments, the transmit threshold may be associated with events that may damage the PCB. This may allow the status monitoring system to transmit events that may cause damage to the PCB as they occur. Including multiple threshold for events may allow the owner to immediately review events over the transmit threshold, while reviewing events after installation that are between the record threshold and the transmit threshold.

Figure 7:
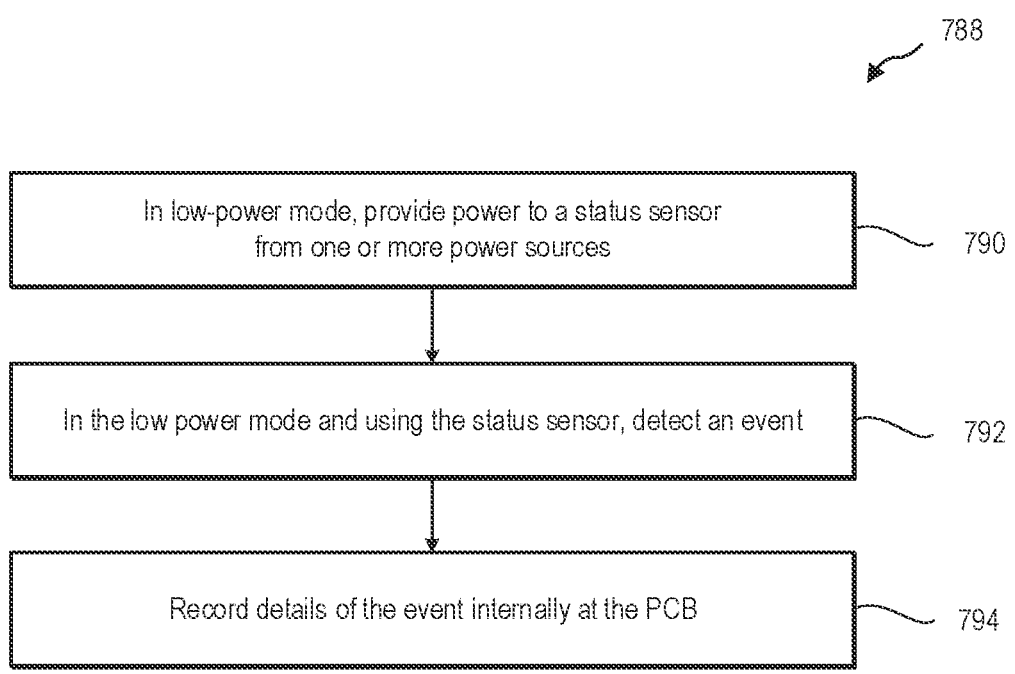
FIG. 7 is a flowchart of a method for monitoring a PCB, according to at least one embodiment of the present disclosure.

As mentioned, FIG. 7 illustrates a flowchart of a method 788 for monitoring a PCB in transit, in accordance with one or more embodiments. While FIG. 7 illustrates acts according to one embodiment, alternative embodiments may omit, add to, reorder, and/or modify any of the acts shown in FIG. 7. The acts of FIG. 7 can be performed as part of a method. Alternatively, a non-transitory computer-readable medium can comprise instructions that, when executed by one or more processors, cause a computing device to perform the acts of FIG. 7. In some embodiments, a system can perform the acts of FIG. 7.

A status monitoring system may, in a low-power mode of the PCB, provide power to a status sensor from a power source located on the PCB at 790. In the low-power mode, the status monitoring system may detect an event impacting the PCB at 792. The status monitoring system may record details of the event internally at the PCB at 794.

In some embodiments, the status monitoring system may transmit details of the event to a remote computing device.

In some embodiments, transmitting the details of the event may include transmitting the details of the event after the PCB is connected to a primary power source. In some embodiments, the status monitoring system may determine that the event has an event magnitude above an event threshold. Based on the event magnitude being above the event threshold, the status monitoring system may transition the PCB from the low-power mode to the transmit mode. The status monitoring system may transmit the details of the event while in the transmit mode.

In some embodiments, the status monitoring system may detect the event while the PCB is in transit. In some embodiments, the status monitoring system may determine that the event has an event magnitude above an event threshold. In some embodiments, recording the event may be based on the event magnitude being above the event threshold. In some embodiments, recording the event includes recording the event associated with a timestamp of the event. In some embodiments, detecting the event may include detect at least one of a temperature event or a shock event.

In some embodiments, detecting the event may include detecting an event associated with transit of the PCB. The event may include a status magnitude that is greater than a threshold status magnitude. In some embodiments, based on the event, the status monitoring system may record the status magnitude on the PCB.

In some embodiments, the status sensor is a first status sensor, the event is a first event type, the status magnitude is a first status magnitude, and the threshold status magnitude is a first threshold status magnitude type. The status monitoring system may, in the low-power mode, monitor a second status sensor connected to the base of the PCB. In some embodiments, the second status sensor may be configured to measure a different status than the first status sensor. In some embodiments, the status monitoring system may detect a second event type associated with the transit of the PCB. The second event type may include a second status magnitude that is greater than a second threshold status magnitude type. In some embodiments, based on the second event type, the second status magnitude may be recorded on the PCB.

Figure 8:
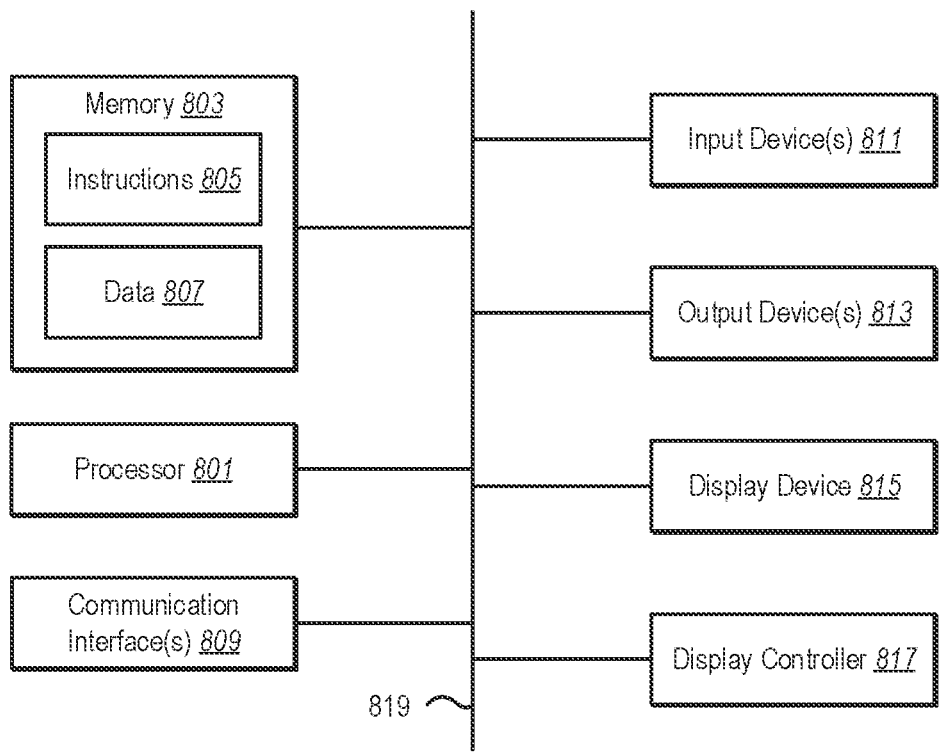
FIG. 8 is a representation of a computing system, according to at least one embodiment of the present disclosure.

FIG. 8 illustrates certain components that may be included within a computer system 801. One or more computer systems 819 may be used to implement the various devices, components, and systems described herein.

The computer system 801 includes a processor 801. The processor 801 may be a general-purpose single or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 801 may be referred to as a central processing unit (CPU). Although just a single processor 801 is shown in the computer system 801 of FIG. 8, in an alternative configuration, a combination of processors (e.g., an ARM and DSP) could be used.

The computer system 801 also includes memory 803 in electronic communication with the processor 801. The memory 803 may be any electronic component capable of storing electronic information. For example, the memory 803 may be embodied as random access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM) memory, registers, and so forth, including combinations thereof.

Instructions 805 and data 807 may be stored in the memory 803. The instructions 805 may be executable by the processor 801 to implement some or all of the functionality disclosed herein. Executing the instructions 805 may involve the use of the data 807 that is stored in the memory 803. Any of the various examples of modules and components described herein may be implemented, partially or wholly, as instructions 805 stored in memory 803 and executed by the processor 801. Any of the various examples of data described herein may be among the data 807 that is stored in memory 803 and used during execution of the instructions 805 by the processor 801.

A computer system 801 may also include one or more communication interfaces 809 for communicating with other electronic devices. The communication interface(s) 809 may be based on wired communication technology, wireless communication technology, or both. Some examples of communication interfaces 809 include a Universal Serial Bus (USB), an Ethernet adapter, a wireless adapter that operates in accordance with an Institute of Electrical and Electronics Engineers (IEEE) 802.11 wireless communication protocol, a Bluetooth® wireless communication adapter, and an infrared (IR) communication port.

A computer system 801 may also include one or more input devices 811 and one or more output devices 813. Some examples of input devices 811 include a keyboard, mouse, microphone, remote control device, button, joystick, trackball, touchpad, and lightpen. Some examples of output devices 813 include a speaker and a printer. One specific type of output device that is typically included in a computer system 801 is a display device 815. Display devices 815 used with embodiments disclosed herein may utilize any suitable image projection technology, such as liquid crystal display (LCD), light-emitting diode (LED), gas plasma, electroluminescence, or the like. A display controller 817 may also be provided, for converting data 807 stored in the memory 803 into text, graphics, and/or moving images (as appropriate) shown on the display device 815.

The various components of the computer system 801 may be coupled together by one or more buses, which may include a power bus, a control signal bus, a status signal bus, a data bus, etc. For the sake of clarity, the various buses are illustrated in FIG. 8 as a bus system 819.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method for monitoring a status of a printed circuit board (PCB), comprising:
in a low-power mode of the PCB, providing power to a status sensor from a power source located on the PCB, wherein the status sensor includes a strain gauge integrally formed below an outer surface of the PCB to measure internal stress or strain experienced by the PCB;

in the low-power mode and using the status sensor, detecting an event impacting the PCB; and recording details of the event at the PCB.

2. The method of claim 1, further comprising transmitting the details of the event to a remote computing device.

3. The method of claim 2, wherein transmitting the details of the event includes transmitting the details of the event after connecting the PCB to a primary power source.

4. The method of claim 2, further comprising:

determining that the event has a status magnitude above an event threshold; and based on the status magnitude being above the event threshold, transitioning the PCB from the low-power mode to a transmit mode, and wherein transmitting the details of the event includes transmitting the details of the event while in the transmit mode.

5. The method of claim 1, wherein detecting the event includes detecting the event while the PCB is in transit.

6. The method of claim 1, further comprising determining that the event has a status magnitude above an event threshold, and wherein recording the event includes recording the event based on the status magnitude being above the event threshold.

7. The method of claim 1, wherein recording the event includes recording the event associated with a timestamp of the event.

8. The method of claim 1, wherein detecting the event includes detecting at least one of a temperature event or a shock event.

9. The method of claim 1, wherein providing power to the status sensor includes providing less than 15 mW of power to the status sensor.

10. The method of claim 1, wherein the strain gauge is deposited as part of an internal layer of the PCB.

11. A printed circuit board (PCB), comprising:

a base;

a status sensor located at the base, wherein the status sensor includes a strain gauge integrally formed internally within a body of the PCB to measure internal stress or strain experienced by the PCB;

a low-power power source providing power to the status sensor; and a memory and processor connected to the status sensor, the memory including instructions which cause the processor to:

in low-power mode, detect an event impacting the PCB using the status sensor; and record details of the event in the memory.

12. The PCB of claim 11, wherein the status sensor is integrally formed with the base.

13. The PCB of claim 11, wherein the status sensor includes at least one of a strain gauge, a temperature sensor, or an accelerometer.

14. The PCB of claim 11, wherein detecting the event includes detecting damage to the base.

15. The PCB of claim 11, wherein the PCB does not include a battery configured to provide operating power to the PCB.

16. The method of claim 11, wherein the strain gauge is deposited as part of an internal layer of the PCB.

17. A method for monitoring a status of a printed circuit board (PCB), comprising:

in a low-power mode, monitoring a status sensor connected to a base of the PCB;

detecting an event associated with transit of the PCB, the event including a status magnitude that is greater than a threshold status magnitude; and based on the event, recording the status magnitude on the PCB, wherein the status magnitude detected by the status sensor includes an internal strain magnitude of the PCB associated with the transit of the PCB, wherein the internal strain magnitude is measured by a strain gauge deposited as part of a layer of the PCB.

18. The method of claim 17, wherein the status sensor is a first status sensor, the event is a first event type, the status magnitude is a first status magnitude, and the threshold status magnitude is a first threshold status magnitude type, and further comprising:

in the low-power mode, monitoring a second status sensor connected to the base of the PCB, the second status sensor being configured to measure a different status than the first status sensor;

detecting a second event type associated with the transit of the PCB, the second event type including a second status magnitude that is greater than a second threshold status magnitude type; and based on the second event type, recording the second status magnitude on the PCB.

19. The method of claim 18, wherein the first status sensor is a temperature sensor and wherein the second status sensor is a strain gauge or an accelerometer.

20. The method of claim 18, wherein the first event type is a temperature event and the second event type is a shock event.

21. The method of claim 17, further comprising associating the event with a responsible agent.

22. The method of claim 21, wherein associating the event with the responsible agent includes corresponding a timestamp of the event with a chain of custody of the PCB.

* * * * *